United States Patent
Nakamura et al.

(10) Patent No.: US 10,884,081 B2
(45) Date of Patent: Jan. 5, 2021

(54) MAGNETIC RESONANCE IMAGING APPARATUS AND METHOD OF TRANSMITTING RF PULSE SIGNAL

(71) Applicant: CANON MEDICAL SYSTEMS CORPORATION, Otawara (JP)

(72) Inventors: Haruki Nakamura, Nasushiobara (JP); Kazuyuki Soejima, Otawara (JP)

(73) Assignee: CANON MEDICAL SYSTEMS CORPORATION, Otawara (JP)

(*) Notice: Subject to any disclaimer, the term of this patent is extended or adjusted under 35 U.S.C. 154(b) by 181 days.

(21) Appl. No.: 16/009,473

(22) Filed: Jun. 15, 2018

(65) Prior Publication Data

US 2018/0364321 A1    Dec. 20, 2018

(30) Foreign Application Priority Data

Jun. 19, 2017    (JP) ................. 2017-119668

(51) Int. Cl.
*G01R 33/36* (2006.01)
*G01R 33/422* (2006.01)

(52) U.S. Cl.
CPC ....... *G01R 33/3607* (2013.01); *G01R 33/422* (2013.01)

(58) Field of Classification Search
CPC .. G01R 33/422; G01R 33/3607; G01R 33/36; G01R 33/561; G01R 33/56; G01R 33/565; G01R 33/54; G01R 33/4833
See application file for complete search history.

(56) References Cited

U.S. PATENT DOCUMENTS

2008/0258732 A1   10/2008 Yoshizawa
2008/0272787 A1*  11/2008 Boskamp ........... G01R 33/3415
                                                   324/322

FOREIGN PATENT DOCUMENTS

JP    2008-264101    11/2008
JP    2013-5956     1/2013

\* cited by examiner

*Primary Examiner* — Jermele M Hollington
*Assistant Examiner* — Suresh K Rajaputra
(74) *Attorney, Agent, or Firm* — Oblon, McClelland, Maier & Neustadt, L.L.P.

(57) ABSTRACT

A magnetic resonance imaging apparatus according to an embodiment includes a transmission channel, a first phase shifter, and a second phase shifter. The transmission channel is configured to arrange, in at least a partial section between a generator and a transmitter coil, radio frequency (RF) pulse signals to be transmitted parallel to one another via a plurality of channels. The first phase shifter is configured to shift at least one of phases of the RF pulse signals to be transmitted via the channels, so that the phases of the RF pulse signals are in a relationship of being different from one another. The second phase shifter is configured to shift, in accordance with a phase amount shifted by the first phase shifter, at least one of phases of the RF pulse signals at a stage prior to inputting the RE pulse signals to the transmitter coil.

9 Claims, 5 Drawing Sheets

FIG.2
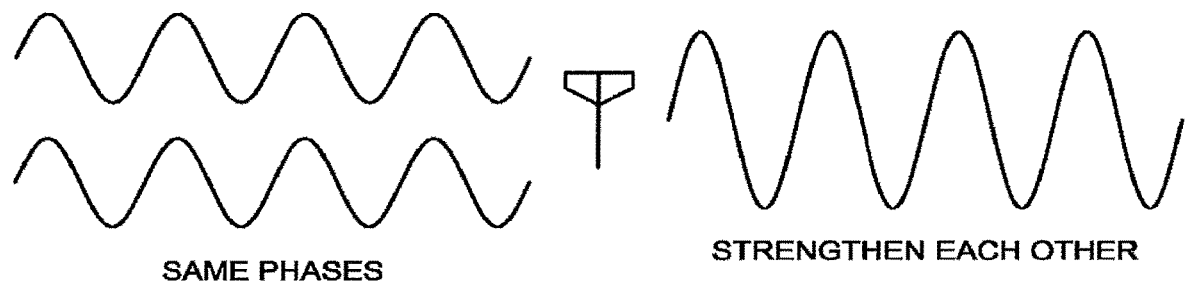
SAME PHASES   STRENGTHEN EACH OTHER
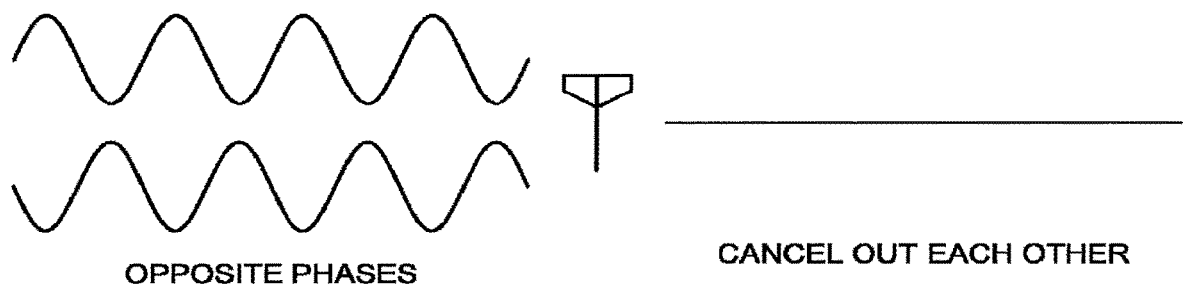
OPPOSITE PHASES   CANCEL OUT EACH OTHER

MAGNETIC RESONANCE IMAGING APPARATUS AND METHOD OF TRANSMITTING RF PULSE SIGNAL

CROSS-REFERENCE TO RELATED APPLICATIONS

This application is based upon and claims the benefit of priority from Japanese Patent Application No. 2017-119068, filed on Jun. 19, 2017; the entire contents of which are incorporated herein by reference.

FIELD

Embodiments described herein relate generally to a magnetic resonance imaging apparatus and a method of transmitting an RE pulse signal.

BACKGROUND

Conventionally, as a technique related to magnetic resonance imaging (MRI) apparatuses, a technique is known by which radio frequency (RE) radiation noise occurring at the time of transmitting RF pulse signals is inhibited for the purpose of being compliant with electromagnetic compatibility (EMC) standards and reducing the noise that may be mixed into a receiving system.

BRIEF DESCRIPTION OF THE DRAWINGS

FIG. 2 is a drawing for explaining an RE radiation noise inhibiting process performed by the MRI apparatus according to the first embodiment;

DETAILED DESCRIPTION

A magnetic resonance imaging apparatus according to an embodiment includes a generator, a transmitter coil, a transmission channel, a first phase shifter, and a second phase shifter. The generator is configured to generate RF pulse signals. The transmitter coil is configured to apply an RE magnetic field to an imaging space in which a subject is placed, on the basis of the RE pulse signals. The transmission channel is configured to arrange, in at least a partial section between the generator and the transmitter coil, the RE pulse signals to be transmitted parallel to one another via a plurality of channels. The first phase shifter is configured to shift at least one of phases of the RF pulse signals to be transmitted via the channels, so that the phases of the RE pulse signals are in a relationship of being different from one another. The second phase shifter is configured to shift, in accordance with a phase amount shifted by the first phase shifter, at least one of phases of the RF pulse signals at a stage prior to inputting the RE pulse signals to the transmitter coil.

First Embodiment

Figure 1:
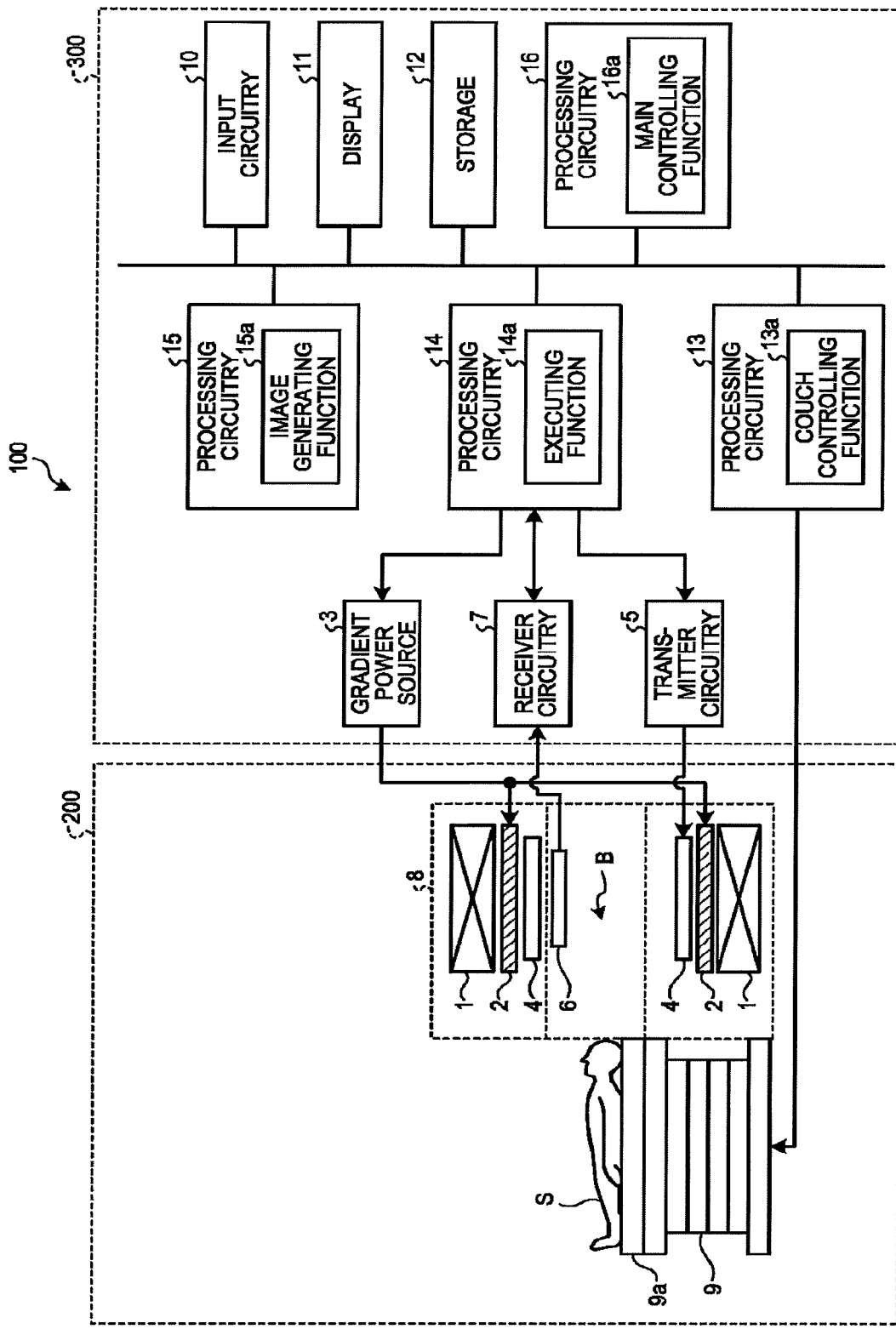
FIG. 1 is a diagram illustrating an exemplary configuration of an MRI apparatus according to a first embodiment.

FIG. 1 is a diagram illustrating an exemplary configuration of an MRI apparatus according to a first embodiment. For example, as illustrated in FIG. 1, an MRI apparatus 100 according to the first embodiment includes: a static magnetic field magnet 1, a gradient coil 2, a gradient power source 3, a transmitter coil 4, transmitter circuitry 5, a receiver coil 6, receiver circuitry 7, a gantry 8, a couch 9, input circuitry 10, a display 11, a storage 12, and processing circuitries 13 to 16.

The static magnetic field magnet 1 is formed to have a hollow and substantially circular cylindrical shape (which may have an oval cross-section orthogonal to the central axis thereof) and is configured to generate a static magnetic field in the space on the inside thereof. For example, the static magnetic field magnet 1 includes a cooling container formed to have a substantially circular cylindrical shape and a magnet such as a superconductive magnet that is immersed in a cooling member (e.g., liquid helium) filling the cooling container. In this situation, for example, the static magnetic field magnet 1 may be configured to generate the static magnetic field by using a permanent magnet. Further, for example, the static magnetic field magnet 1 does not necessarily need to be formed to have a substantially circular cylindrical shape and may have a so-called open structure in which a pair of magnets is arranged so as to face each other while an imaging space where a subject S is placed is interposed therebetween.

The gradient coil 2 is formed to have a hollow and substantially circular cylindrical shape (which may have an oval cross-section orthogonal to the central axis thereof) and is disposed on the inside of the static magnetic field magnet 1. The gradient coil 2 includes three coils configured to generate gradient magnetic fields along x-, y-, and z-axes, respectively, that are orthogonal to one another. In this situation, the x-axis, the v-axis, and the z-axis structure an apparatus coordinate system unique to the MRI apparatus 100. For example, the x-axis direction is set in the horizontal direction, whereas the y-axis direction is set in the vertical direction. Further, the z-axis direction is set so as to be the same as the direction of a magnetic flux in the static magnetic field generated by the static magnetic field magnet 1.

By individually supplying an electric current to each of the three coils included in the gradient coil 2, the gradient power source is configured to cause the gradient magnetic fields to be generated along the x-, y-, and z-axes, respectively, in the space formed inside the gradient coil 2. The gradient power source 3 is able to cause the gradient magnetic fields to be generated along a read-out direction, a phase-encoding direction, and a slice direction, by generating the gradient magnetic fields along the x-, y-, and z-axes, as appropriate.

In this situation, the axes extending along the read-out direction, the phase-encoding direction, and the slice direction structure a logical coordinate system used for defining slice regions or a volume region serving as a target of an imaging process. In the following sections, the gradient magnetic field generated along the read-out direction will be referred to as a read-out gradient magnetic field; the gradient magnetic field generated along the phase-encoding direction will be referred to as a phase-encoding gradient magnetic field; and the gradient magnetic field generated along the slice direction will be referred to as a slice gradient magnetic field.

Further, the gradient magnetic fields are superimposed on the static magnetic field generated by the static magnetic field magnet 1 and are used for appending spatial position information to magnetic resonance (MR) signals. More specifically, the read-out gradient magnetic field appends position information along the read-out direction to an MR signal, by varying the frequency of the MR signal in accordance with the position in the read-out direction. Further, the phase-encoding gradient magnetic field appends position information in the phase-encoding direction to an MR signal, by varying the phase of the MR signal along the phase-encoding direction. Further, when an imaging region is represented by slice regions, the slice gradient magnetic field is used for determining the orientations, the thicknesses, and the quantity of the slice regions. In contrast, when the imaging region is represented by a volume region, the slice gradient magnetic field appends position information along the slice direction to an MR signal, by varying the phase of the MR signal in accordance with the position in the slice direction.

The transmitter coil 4 is a Radio Frequency (RE) coil configured, on the basis of an RF pulse signal output from the transmitter circuitry 5, to apply an RF magnetic field to the imaging space in which the subject S is placed. More specifically, the transmitter coil 4 is formed to have a hollow and substantially circular cylindrical shape (which may have an oval cross-section orthogonal to the central axis thereof) and is disposed on the inside of the gradient coil 2. Further, on the basis of the RE pulse signal output from the transmitter circuitry 5, the transmitter coil 4 is configured to apply the RE magnetic field to the imaging space formed on the inside thereof.

The transmitter circuitry 5 is configured to output the RF pulse signal corresponding to a Larmor frequency to the transmitter coil 4.

The receiver coil 6 is an RF coil configured to receive MR signals emitted from the subject S. For example, the receiver coil 6 is attached to the subject S placed on the inside of the transmitter coil 4 and is configured to receive the MR signals emitted from the subject S due to an influence of the RF magnetic fields applied by the transmitter coil 4. Further, the receiver coil 6 is configured to output the received MR signals to the receiver circuitry 7. For example, as the receiver coil 6, a coil dedicated for each of the various sites serving as targets of imaging processes is used. In this situation, examples of the coils dedicated for the various sites include a receiver coil for the head, a receiver coil for the neck, a receiver coil for a shoulder, a receiver coil for the chest, a receiver coil for the abdomen, a receiver coil for a leg, and a receiver coil for the spine.

The receiver circuitry 7 is configured to generate MR signal data on the basis of the MR signals output from the receiver coil 6 and to output the generated MR signal data to the processing circuitry 14.

In the present example, the situation in which the transmitter coil 4 applies the RE magnetic field so that the receiver coil 6 receives the MR signals is explained; however, possible embodiments of the RF coils are not limited to this example. For instance, the transmitter coil 4 may further have a receiving function to receive the MR signals. Further, the receiver coil 6 may further have a transmitting function to apply the RF magnetic field. When the transmitter coil 4 has the receiving function, the receiver circuitry 7 generates MR signal data also from the MR signals received by the transmitter coil 4. Further, when the receiver coil 6 has the transmitting function, the transmitter circuitry 5 outputs an RF pulse signal also to the receiver coil 6.

The gantry 8 houses therein the static magnetic field magnet 1, the gradient coil 2, and the transmitter coil 4. More specifically, the gantry 8 has a bore B that is hollow and is formed to have a circular cylindrical shape. While the static magnetic field magnet. 1, the gradient coil 2, and the transmitter coil 4 are disposed so as to surround the bore B, the gantry 8 houses therein the static magnetic field magnet 1, the gradient coil 2, and the transmitter coil 4. In this situation, the space on the inside of the bore B of the gantry 8 corresponds to the imaging space in which the subject S is placed when an imaging process is performed on the subject S.

The couch 9 includes a couchtop 9a on which the subject S is placed. When an imaging process is performed on the subject S, the couchtop 9a is inserted to the inside of the bore B of the gantry 8. For example, the couch 9 is installed in such a manner that the longitudinal direction thereof extends parallel to the central axis of the static magnetic field magnet 1.

The input circuitry 10 is configured to receive operations to input various types of instructions and various types of information from the operator. More specifically, the input circuitry 10 is connected to the processing circuitry 16 and is configured to convert the input operations received from the operator into electrical signals and to output the electrical signals to the processing circuitry 16. For example, the input circuitry 10 is realized with a trackball, a switch button, a mouse, a keyboard, a touch panel, and/or the like.

The display 11 is configured to display various types of information and various types of images. More specifically, the display 11 is connected to the processing circuitry 16 and is configured to convert the various types of information and data of the various types of images sent thereto from the processing circuitry 16, into display-purpose electrical signals and to output the display-purpose electrical signals. For example, the display 11 is realized with a liquid crystal monitor, a Cathode Ray Tube (CRT) monitor, a touch panel, or the like.

The storage 12 is configured to store various types of data therein. More specifically, the storage 12 is configured to store therein the MR signal data and image data. For example, the storage 12 is realized with a semiconductor memory device such as a Random Access Memory (RAM), a flash memory, or the like, or a hard disk, an optical disk, or the like.

The processing circuitry 13 includes a couch controlling function 13a. For example, the processing circuitry 1g is realized with a processor. The couch controlling function 13a is connected to the couch 9 and is configured to control operations of the couch 9 by outputting a control-purpose electrical signal to the couch 9. For example, the couch controlling function 13a receives, via the input circuitry 10, an instruction to move the couchtop 9a in a longitudinal direction, an up-and-down direction, or left-and-right direction from the operator and operates a driving mechanism for the couchtop 9a included in the couch 9 so as to move the couchtop 9a according to the received instruction.

The processing circuitry 14 includes an executing function 14a. For example, the processing circuitry 14 is realized with a processor. The executing function 14a is configured to perform a data acquisition to acquire the MR signal data by driving the gradient power source 3, the transmitter circuitry 5, and the receiver circuitry 7, on the basis of sequence execution data output from the processing circuitry 16.

In this situation, the sequence execution data is information that defines a pulse sequence indicating a procedure performed to acquire the MR signal data. More specifically, the sequence execution data is information that defines: the timing with which the electric current is to be supplied from the gradient power source 3 to the gradient coil 2 and the intensity of the electric current to be supplied; the intensity of the RF pulse signal to be supplied from the transmitter circuitry 5 to the transmitter coil 4 and the timing with which the RF pulse signal is to be supplied; the timing with which the MR signals are to be detected by the receiver circuitry 7, and the like.

Further, the executing function 14a is configured to receive the MR signal data from the receiver circuitry 7 as a result of executing various types of pulse sequences and to store the received MR signal data into the storage 12. A set made up of pieces of MR signal data received by the executing function 14a stored in the storage 12 as data structuring a k-space as a result of being arranged two-dimensionally or three-dimensionally according to the position information appended by the read-out gradient magnetic field, the phase-encoding gradient magnetic field, and the slice gradient magnetic field described above.

The processing circuitry 15 includes an image generating function 15a. For example, the processing circuitry 15 is realized with a processor. The image generating function 15a is configured to generate an image on the basis of the MR signal data stored in the storage 12. More specifically, the image generating function 15a generates the image by reading the MR signal data stored into the storage 12 by the executing function 14a and further performing a reconstructing process such as a post-processing process (i.e., a Fourier transform or the like) on the read MR signal data. Further, the image generating function 15a stores image data of the generated image into the storage 12.

The processing circuitry 16 includes a main controlling function 16a. For example, the processing circuitry 16 is realized with a processor. The main controlling function 16a is configured to exercise overall control of the MRI apparatus 100 by controlling constituent elements of the MRI apparatus 100. For example, the main controlling function 16a receives an imaging condition (e.g., an input of various types of parameters related to the pulse sequence) from the operator via the input circuitry 10 and generates the sequence execution data on the basis of the received imaging condition. After that, the main controlling function 16a executes various types of pulse sequences by transmitting the generated sequence execution data to the processing circuitry 14. Further, for example, the main controlling function 16a reads the image data of an image requested by the operator from the storage 12 and outputs the read image to the display 11.

In this situation, for example, the processing functions of the processing circuitries 13 to 16 described above are stored in the storage 12 in the form of computer-executable programs. By reading a corresponding one of the programs from the storage 12 and executing the read program, each of the processing circuitries realizes the processing function corresponding to the program. In other words, each of the processing circuitries 13 to 16 that has read the corresponding program has the corresponding one of the processing functions illustrated in FIG. 1.

In the example illustrated in FIG. 1, the processing functions of the couch controlling function 13a, the executing function 14a, the image generating function 15a, and the main controlling function 16a are each realized by a single processing circuit; however, possible embodiments are not limited to this example. Any of these processing functions may be realized as being distributed to a plurality of processing circuitries or being integrated into a single processing circuitry, as appropriate.

The term "processor" used in the above embodiment denotes, for example, a central processing unit (CPU), a graphics processing unit (GPU), or a circuit such as an application specific integrated circuit (ASIC) or a programmable logic device (e.g., a simple programmable logic device (SPLD), a complex programmable logic device (CPLD), or a field programmable gate array (FPGA)). In this situation, instead of saving the programs in the storage 12, it is also acceptable to directly incorporate the programs in the circuits of the processors. In that situation, the processors realize the functions thereof by reading and executing the programs incorporated in the circuits thereof. Further, the processors in the present embodiment do not each necessarily have to be structured as a single circuit. It is also acceptable to structure one processor by combining together a plurality of independent circuits so as to realize the functions thereof.

An exemplary configuration of the MRI apparatus 100 according to the first embodiment has thus been explained. In the present example, the constituent elements of the PRI apparatus 100 described above are installed as being separated in a shield room 200 and a mechanical room 300. The shield room 200 is configured to shield the space in the room from electromagnetic noise occurring on the outside of the room and is also configured to prevent electromagnetic noise occurring in the room from leaking to the outside of the room.

For example, the static magnetic field magnet 1, the gradient coil 2, the transmitter coil 4, the receiver coil 6, the gantry 8, and the couch 9 are installed in the shield room 200. Further, the gradient power source 3, the transmitter circuitry 5, the receiver circuitry 7, the input circuitry 10, the display 11, the storage 12, and the processing circuitries 13 to are installed in the mechanical room 300.

In this situation, for the purpose of being compliant with Electromagnetic Compatibility (EMC) standards and reducing the noise that may be mixed into the receiving system, the MRI apparatus 100 is configured to inhibit RE radiation noise occurring at the time of transmitting the RF pulse signals. For example, a ferrite core may be attached to a transmission cable used for transmitting the RF pulse signals, or shielding for the transmission cable or the casing may be strengthened.

However, with these arrangements, there may be some situations where it is impossible to sufficiently achieve the effect of reducing the RF radiation noise. In particular, the RF radiation noise from the transmission cable is considered to be significant. For this reason, the MRI apparatus 100 according to the first embodiment is configured to be able to inhibit the RE radiation noise occurring in the transmission channel at the time of transmitting the RF pulse signals.

More specifically, the MRI apparatus 100 according to the first embodiment includes a generator, the transmitter coil 4, a transmission channel, a first phase shifter, and a second phase shifter. The generator is configured to generate waveforms of RF pulse signals. The transmitter coil 4 is configured to apply an RF magnetic field to the imaging space in which the subject S is placed on the basis of the RF pulse signals. The transmission channel is configured to arrange, in at least a partial section between the generator and the transmitter coil 4, the RF pulse signals to be transmitted parallel to one another via a plurality of channels. The first phase shifter is configured to arrange the phases of the RF pulse signals transmitted via the plurality of channels to vary among the channels. The second phase shifter is configured to shift, in accordance with a phase amount shifted by the first phase shifter, at least one of phases of the RF pulse signals which have been transmitted via the channels, at a stage prior to inputting the RF pulse signals to the transmitter coil 4.

FIG. 2 is a drawing for explaining the RF radiation noise inhibiting process performed by the MRI apparatus 100 according to the first embodiment. For example, as illustrated in FIG. 2, in the situation where radio waves are emitted from a plurality of locations, when the radio waves from the plurality of locations have the same phase as each other, the radio waves strengthen each other. As a result, at the point in time when the radio waves are measured by antennas or the like, larger values are measured. In contrast, when the radio waves from the plurality of locations have phases opposite to each other, the radio waves cancel out each other. As a result, at the point in time when the radio waves are measured by antennas or the like, smaller values are measured.

By utilizing such characteristics of radio waves, the MRI apparatus 100 according to the first embodiment is configured to provide a plurality of channels in at least a partial section of the transmission channel used for transmitting RF pulse signals and to arrange the phases of the RF pulse signals transmitted parallel to one another via the plurality of channels to be different from one another. With this arrangement, the RF radiation noises occurring from the channels in the section cancel out each other. It is therefore possible to inhibit the RF radiation noise occurring in the transmission channels at the time of transmitting the RF pulse signals.

Figure 3:
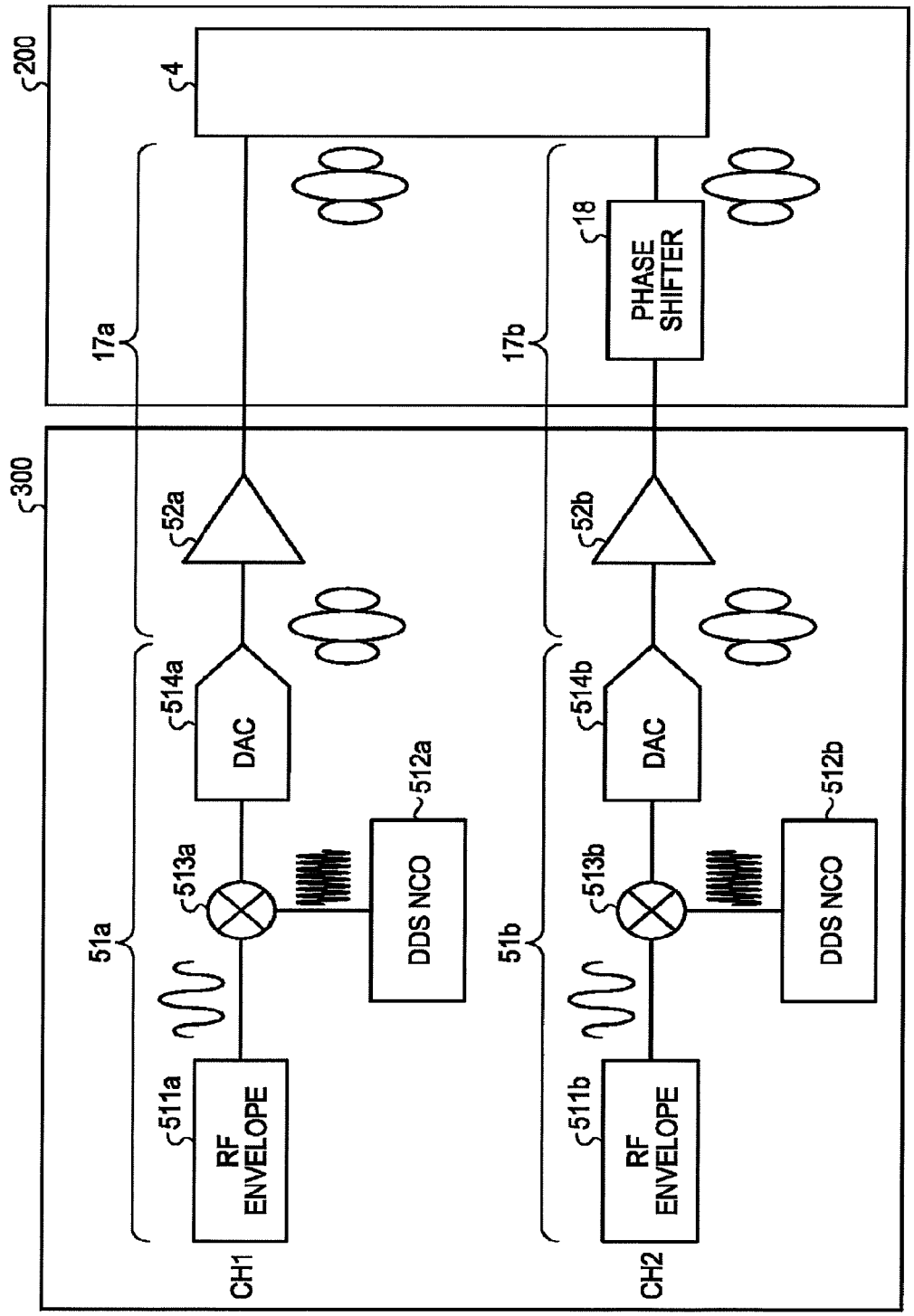
FIG. 3 is a diagram illustrating an exemplary configuration of a transmitting system of the MRI apparatus according to the first embodiment.

FIG. 3 is a diagram illustrating an exemplary configuration of a transmitting system of the MRI apparatus 100 according to the first embodiment. In the first embodiment, an example will be explained in which the transmitter coil 4 has two power supply points, so that RF pulse signals are supplied to the power supply points of the transmitter coil 4 via two transmission channels.

For example, as illustrated in FIG. 3, the MRI apparatus 100 according to the first embodiment includes first generating circuitry 51a, second generating circuitry 51b, first amplifying circuitry 52a, second amplifying circuitry 52b, a first transmission channel 17a, a second transmission channel 17b, phase shifting circuitry 18, and the transmitter coil 4. In this situation, the first generating circuitry 51a, the second generating circuitry 51b, the first amplifying circuitry 52a, and the second amplifying circuitry 52b are included in the transmitter circuitry 5 illustrated in FIG. 1.

The first generating circuitry 51a is configured to generate a first RF pulse signal. For example, the first generating circuitry 51a includes first waveform generating circuitry 511a, first oscillating circuitry 512a, first mixing circuitry 513a, and a first digital/analog (DA) converting circuitry 514a. The first generating circuitry 51a is an example of the generator described above.

The first waveform generating circuitry 511a is configured to generate an RF waveform signal expressing the waveform of the first IF pulse signal. For example, as the RF waveform signal, the first waveform generating circuitry 511a generates a waveform defined by an envelope expressed with a sinc function.

The first oscillating circuitry 512a is configured to generate a digital carrier wave signal having a resonant frequency unique to a target atomic nucleus placed in the static magnetic field. For example, the first oscillating circuitry 512a may be represented by numerically controlled oscillators (NCOs) and realized by using a direct digital synthesizer (DDS).

The first mixing circuitry 513a is configured to generate the first RE pulse signal, by modulating the digital carrier wave signal generated by the first oscillating circuitry 512a with the RF waveform signal generated by the first waveform generating circuitry 511a.

The first DA converting circuitry 514a is configured to convert the first RF pulse signal generated by the first mixing circuitry 513a into an analog signal and to output the analog signal.

The second generating circuitry 51b is configured to generate a second RF pulse signal. For example, the second generating circuitry 51b includes second waveform generating circuitry 511b, second oscillating circuitry 512b, second mixing circuitry 513b, and second DA converting circuitry 514b. The second generating circuitry 51b is an example of the generator described above.

The second waveform generating circuitry 511b is configured to generate an RE waveform signal expressing the waveform of the second RF pulse signal. For example, as the RF waveform signal, the second waveform generating circuitry 511b generates a waveform defined by an envelope expressed with a sine function.

The second oscillating circuitry 512b is configured to generate a digital carrier wave signal having a resonant frequency unique to a target atomic nucleus placed in the static magnetic field. For example, the second oscillating circuitry 512b may be represented by NCOs and realized by using a DDS.

The second mixing circuitry 513b is configured to generate the second RF pulse signal by modulating the digital carrier wave signal generated by the second oscillating circuitry 512b with the RF waveform signal generated by the second waveform generating circuitry 511b.

The second DA converting circuitry 514b is configured to convert the second RF pulse signal generated by the second mixing circuitry 513b into an analog signal and to output the analog signal.

The first amplifying circuitry 52a is provided at a stage subsequent to the first generating circuitry 51a and is configured to amplify the first RF pulse signal generated by the first generating circuitry 51a.

The second amplifying circuitry 52b is provided at a stage subsequent to the second generating circuitry 51b and is configured to amplify the second RE pulse signal generated by the second generating circuitry 51b.

The first transmission channel 17a is provided between the first generating circuitry 51a and the transmitter coil 4 and is configured to arrange the first RF pulse signal generated by the first generating circuitry 51a to be transmitted to the transmitter coil 4. For example, the first transmission channel 17a is realized with a signal line cable.

The second transmission channel 17b is provided between the second generating circuitry 51b and the transmitter coil 4 and is configured to arrange the second RE pulse signal generated by the second generating circuitry 51b to be transmitted to the transmitter coil 4. For example, the second transmission channel 17b is realized with a signal line cable.

In this situation, in the first embodiment, the first oscillating circuitry 512a included in the first generating circuitry 51a and the second oscillating circuitry 512b included in the second generating circuitry 51b function as the first phase shifter described above. More specifically, the first oscillating circuitry 512a and the second oscillating circuitry 512b are configured to arrange the phases of the RF pulse signals to be different from each other, by using the respective DDS included therein. For example, one selected from between the first oscillating circuitry 512a and the second oscillating circuitry 512b generates a digital carrier wave signal obtained by inverting, by 180°, the phase of the digital carrier wave signal generated by the other of the two. As a result, the phase of the first RF pulse signal output from the first DA converting circuitry 514a and the phase of the second RE pulse signal output from the second DA converting circuitry 514b are opposite phases of each other being different by 180°.

Further, in the first embodiment, the first transmission channel 17a and the second transmission channel 17b arrange the first RF pulse signal and the second RF pulse signal to be transmitted parallel to each other.

With this arrangement, the phase of the first RF pulse signal and the phase of the second RE pulse signal are opposite to each other. Consequently, in at least a partial section on the outside of the shield room 200, the RF radiation noise occurring from the first transmission channel 17a and the RE radiation noise occurring from the second transmission channel 17b cancel out each other. As a result, it is possible to inhibit the RF radiation noise occurring in the transmission channels at the time of transmitting the RF pulse signals.

The phase shifting circuitry 18 is provided on the second transmission channel 17b at a stage preceding the transmitter coil 4 and is configured to arrange the phase of the second RE pulse signal transmitted via the second transmission channel 17b to match a phase required by the specification of the transmitter coil 4. In this situation, the phase shifting circuitry 18 is an example of the second phase shifter described above.

For example, when the transmitter coil 4 is configured, like a quadrature detection (QD) coil, to require RF pulse signals of which the phases are different from each other by 90° to be supplied to two power supply points, the phase shifting circuitry 18 arranges the phase of the second RE pulse signal to be different from the phase of the first RE pulse signal by 90°, by shifting the phase of the second RF pulse signal by –90°.

In this situation, the amount by which the phase shifting circuitry 18 shifts the phase of the second RF pulse signal does not necessarily have to be –90°. For example, when the transmitter coil 4 is configured to require RE pulse signals of which the phases are different from each other by 120° to be supplied to two power supply points, the phase shifting circuitry 18 may arrange the phase of the second RF pulse signal to be different from the phase of the first RF pulse signal by 120°, by shifting the phase of the second RF pulse signal by –60°.

The phase shifting circuitry 18 does not necessarily have to be a so-called digital circuit and may be realized by using a cable. In that situation, by arranging the length of the cable of the second transmission channel 17b to be partially longer than that of the cable of the first transmission channel 17a at a stage preceding the transmitter coil 4, the phase of the second RF pulse signal is arranged to be different before the signal reaches the transmitter coil 4.

In the manner described above, in the shield room 200, the phases of the RE pulse signals transmitted via the two transmission channels are arranged by the phase shifting circuitry 18 to be different from the opposite phases; However, because the RE radiation noise is prevented by the shield room 200 from leaking to the outside of the room, no impact is made on EMC performance.

As explained above, in the first embodiment, the first RF pulse signal transmitted via the first transmission channel 17a and the second RF pulse signal transmitted via the second transmission channel 17b are transmitted while being arranged to have the opposite phases of each other. With this arrangement, the RF radiation noises occurring from the transmission channels cancel out each other. It is therefore possible to inhibit the RE radiation noise occurring in the transmission channels at the time of transmitting the RE pulse signals. Further, because the unnecessary RF radiation noise is inhibited, it is possible to enhance EMC performance of the MRI apparatus 100.

Second Embodiment

In the first embodiment described above, an example is explained in which generating circuitry is provided for each of the transmission channels; however, possible embodiments are not limited to this example. For instance, another arrangement is also acceptable in which an RE pulse signal generated by single generating circuitry is transmitted as being divided among a plurality of channels.

In the following sections, such an example will be explained as a second embodiment. An MRI apparatus according to the second embodiment has an overall configuration similar to that illustrated in FIG. 1, except that only the configuration of the transmitting system is different. Thus, in the following sections, the second embodiment will be explained while a focus is placed on differences from the first embodiment. Some of the constituent elements that are the same as those in the first embodiment will be referred to by using the same reference characters, and detailed explanations thereof will be omitted.

More specifically, the MRI apparatus 100 according to the second embodiment includes a divider that is provided at a stage subsequent to the generator and is configured to arrange the RF pulse signal generated by the generator to be divided among a plurality of channels. Further, the MRI apparatus 100 according to the second embodiment includes a second phase shifter that is provided at a stage preceding the transmitter coil 4 and is configured to arrange the phases of the RF pulse signals transmitted via the plurality of channels to be the same as one another. Further, the MRI apparatus 100 according to the second embodiment includes a combiner that is provided at a stage preceding the transmitter coil 4 and is configured to combine together the RF pulse signals of which the phases are arranged to be the same as one another by the second phase shifter.

Figure 4:
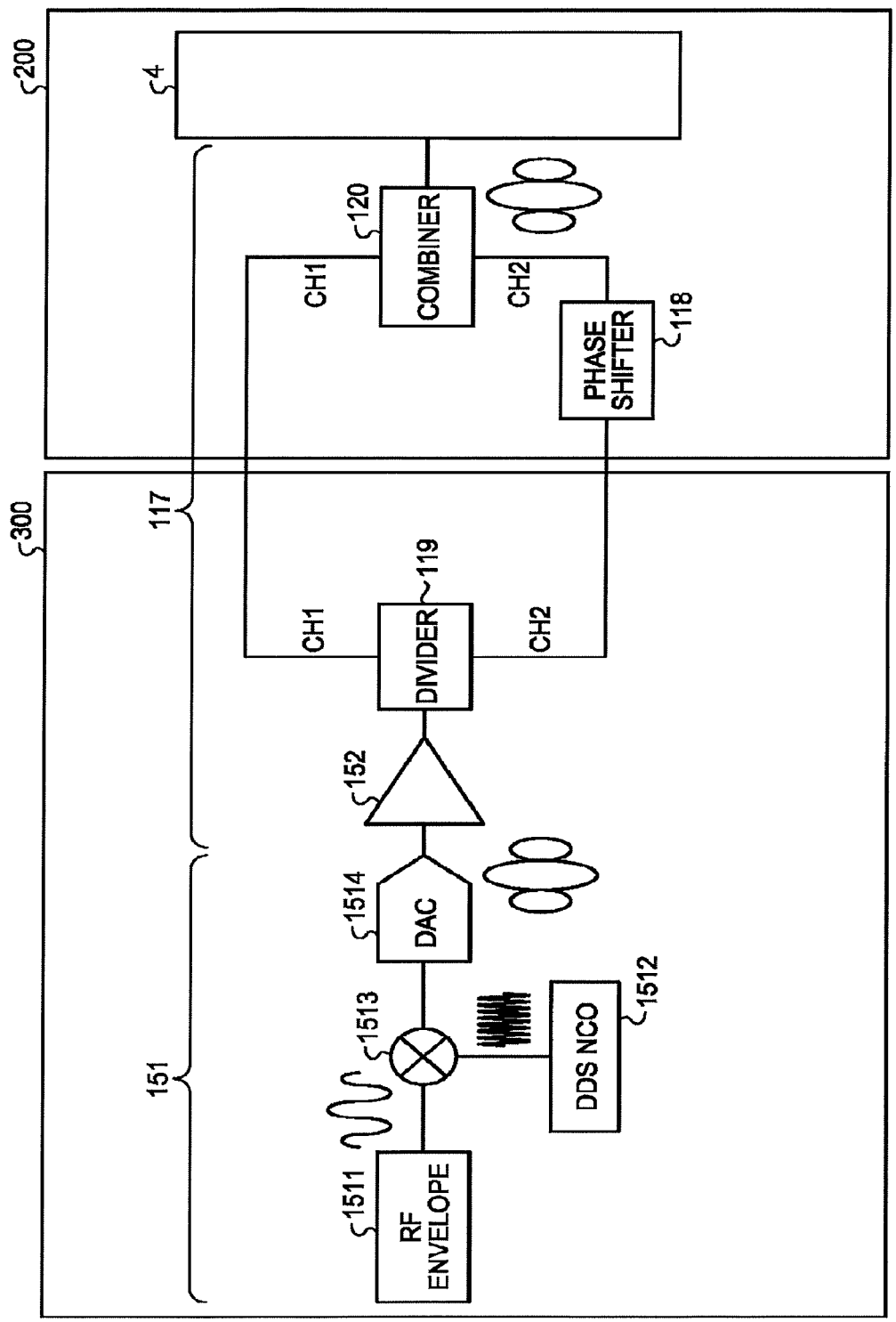
FIG. 4 is a diagram illustrating an exemplary configuration of a transmitting system of an MRI apparatus according to a second embodiment.

FIG. 4 is a diagram illustrating an exemplary configuration of the transmitting system of the MRI apparatus 100 according to the second embodiment. In the second embodiment, an example will be explained in which the transmitter coil 4 has one power supply point, while the RF pulse signals transmitted via two channels are combined into one signal to be supplied to the power supply point of the transmitter coil 4.

For example, as illustrated in FIG. 4, the MRI apparatus 100 according to the second embodiment includes a generating circuitry 151, a transmission channel 117, amplifying circuitry 152, dividing circuitry 119, phase shifting circuitry 118, combining circuitry 120, and the transmitter coil 4. In this situation, the generating circuitry 151 and the amplifying circuitry 152 are included in the transmitter circuitry 5 illustrated in FIG. 1.

The generating circuitry 151 is configured to generate an RF pulse signal. For example, the generating circuitry 151 includes waveform generating circuitry 1511, oscillating circuitry 1512, mixing circuitry 1513, and DA converting circuitry 1514. In this situation, the generating circuitry 151 is an example of the generator described above.

The waveform generating circuitry 1511 is configured to generate an RF waveform signal expressing the waveform of the RF pulse signal. For example, as the RF waveform signal, the waveform generating circuitry 1511 generates a waveform defined by an envelope expressed with a sinc function.

The oscillating circuitry 1512 is configured to generate a digital carrier wave signal having a resonant frequency unique to a target atomic nucleus placed in the static magnetic field. For example, the oscillating circuitry 1512 may be represented by NCOs and realized by using a DDS.

The mixing circuitry 1513 is configured to generate the RF pulse signal by modulating the digital carrier wave signal generated by the oscillating circuitry 1512 with the RF waveform signal generated by the waveform generating circuitry 1511.

The DA converting circuitry 1514 is configured to convert the RE pulse signal generated by the mixing circuitry 1513 into an analog signal and to output the analog signal.

The amplifying circuitry 152 is provided at a stage subsequent to the generating circuitry 151 and is configured to amplify the RF pulse signal generated by the generating circuitry 151.

The transmission channel 117 is provided between the generating circuitry 151 and the transmitter coil 4 and is configured to arrange the RF pulse signal generated by the generating circuitry 151 to be transmitted to the transmitter coil 4. For example, the transmission channel 117 is realized with a signal line cable.

Further, in the second embodiment, in at least a partial section on the outside of the shield room 200, the transmission channel 117 is configured to arrange RF pulse signals to be transmitted parallel to each other via two channels.

The dividing circuitry 119 is provided at a stage subsequent to the generating circuitry 151 and is configured to arrange the RF pulse signal generated by the generating circuitry 151 to be divided into the two channels included in the transmission channel 117. In this situation, the dividing circuitry 119 is an example of the divider described above.

In the second embodiment, the dividing circuitry 119 functions as the first phase shifter described above. More specifically, of the two channels included in the transmission channel 117, the dividing circuitry 119 is configured to output a first RE pulse signal to a first channel CH1 and to output a second RF pulse signal of which the phase is inverted from the phase of the first RE pulse signal by 180°, to a second channel CH2. As a result, the phase of the first RF pulse signal output to the first channel CH1 and the phase of the second RF pulse signal output to the second channel CH2 are opposite phases of each other being different by 180°. In this situation, for example, the dividing circuitry 119 is configured to output the first RE pulse signal and the second RF pulse signal with the same amplitude as each other.

With this arrangement, because the phase of the first RF pulse signal and the phase of the second RE pulse signal are opposite phases of each other, the RF radiation noise occurring from the first channel CH1 and the RF radiation noise occurring from the second channel CH2 cancel out each other, in at least the partial section on the outside of the shield room 200. Consequently, it is possible to inhibit the RF radiation noise occurring in the transmission channels at the time of transmitting the RE pulse signals.

The phase shifting circuitry 118 is provided at a stage preceding the transmitter coil 4 and is configured to arrange the phases of the RE pulse signals transmitted via the two channels included in the transmission channel 117 to be the same as each other. In this situation, the phase shifting circuitry 118 is an example of the second phase shifter described above.

In this situation, the phase shifting circuitry 118 does not necessarily have to be a so-called digital circuit and may be realized by using a cable. In that situation, by arranging the length of the cable of the channel used for transmitting the second RF pulse signal to be partially longer than that of the cable used for transmitting the first RF pulse signal at a stage preceding the transmitter coil 4, the phase of the second RF pulse signal is arranged to be different before the signal reaches the transmitter coil 4.

The combining circuitry 120 is provided at a stage preceding the transmitter coil 4 and is configured to combine together the RF pulse signals of which the phases are arranged to be the same as one another by the phase shifting circuitry 118. In this situation, the combining circuitry 120 is an example of the combiner described above.

As explained above, in the second embodiment, the first RF pulse signal transmitted via the first channel CH1 and the second RE pulse signal transmitted via the second channel CH2 are transmitted while having the opposite phases of each other, the first channel CH1 and the second channel CH2 being included in the transmission channel 117. With this arrangement, the RE radiation noises occurring from the channels cancel out each other. It is therefore possible to inhibit the RF radiation noise occurring in the transmission channels at the time of transmitting the RF pulse signals. Further, because the unnecessary RE radiation noise is inhibited, it is possible to enhance EMC performance of the MRI apparatus 100.

Third Embodiment

In the second embodiment described above, the example is explained in which the combining circuitry 120 combines the RF pulse signals together and supplies the combined result to the transmitter coil 4; however, possible embodiments are not limited to this example. For instance, when the transmitter coil 4 includes two power supply points similarly to the first embodiment, it is acceptable to cause phase shifting circuitry to shift the phase of one of the RE pulse signals divided by the dividing circuitry 119 into the two channels, before the signal is supplied to one of the power supply points of the transmitter coil 4.

In the following sections, such an example will be explained as a third embodiment. An MRI apparatus according to the third embodiment has an overall configuration similar to that illustrated in FIG. 1, except that only the configuration of the transmitting system is different. Thus, in the following sections, the third embodiment will be explained while a focus is placed on differences from the first and the second embodiments. Some of the constituent elements that are the same as those in the first and the second embodiments will be referred to by using the same reference characters, and detailed explanations thereof will be omitted.

Figure 5:
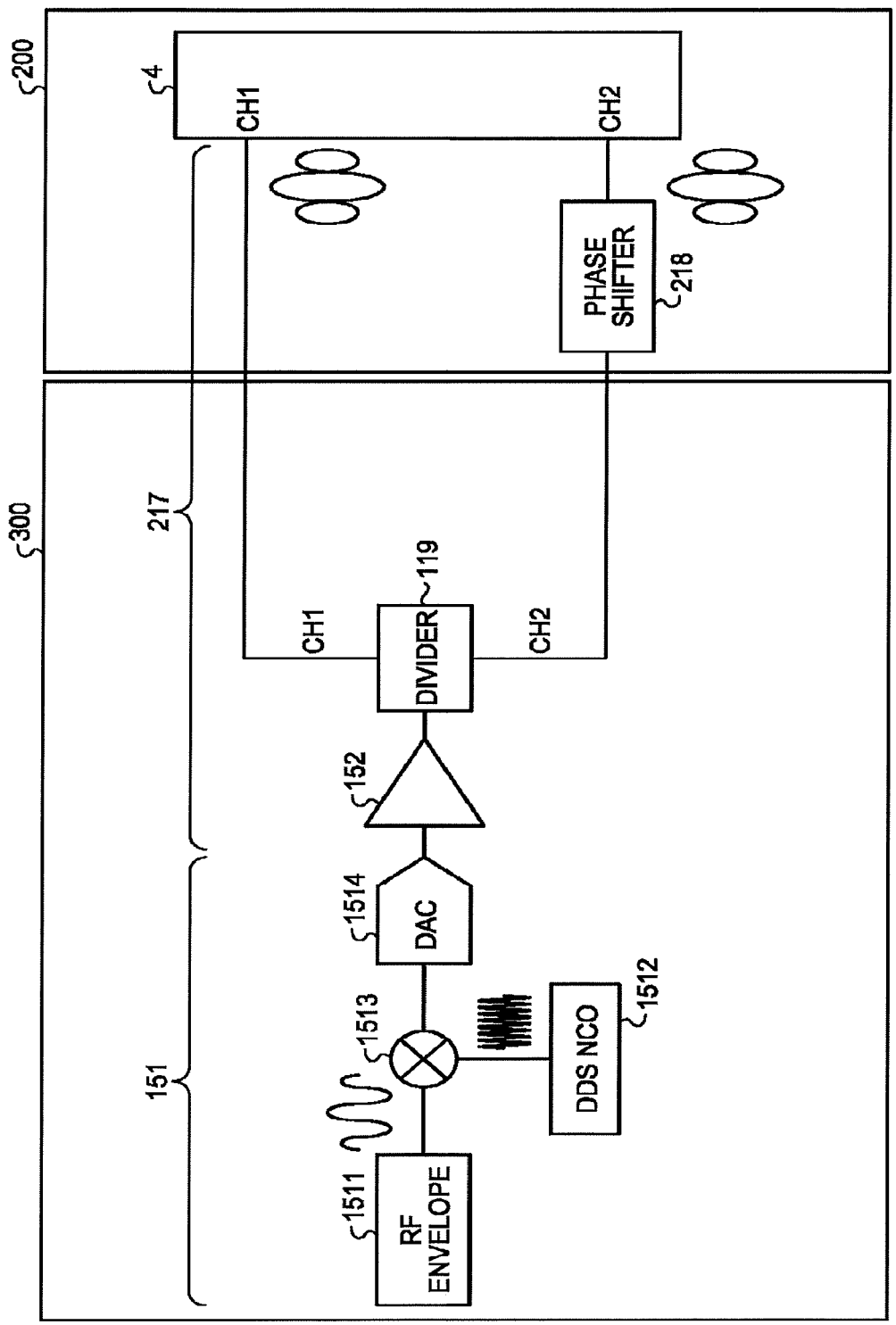
FIG. 5 is a diagram illustrating an exemplary configuration of a transmitting system of an MRI apparatus according to a third embodiment.

FIG. 5 is a diagram illustrating an exemplary configuration of the transmitting system of the MRI apparatus 100 according to the third embodiment. In the third embodiment, an example will be explained in which, similarly to the example illustrated in FIG. 3, the transmitter coil 4 has two power supply points, so that RF pulse signals are supplied to the power supply points of the transmitter coil 4 via two transmission channels.

For example, as illustrated in FIG. 5, the MRI apparatus 100 according to the third embodiment includes the generating circuitry 151, a transmission channel 217, the amplifying circuitry 152, the dividing circuitry 119, phase shifting circuitry 218, and the transmitter coil 4. In this situation, the generating circuitry 151 and the amplifying circuitry 152 are included in the transmitter circuitry 5 illustrated in FIG. 1.

The transmission channel 217 is provided between the venerating circuitry 151 and the transmitter coil 4 and is configured to arrange the RF pulse signal generated by the generating circuitry 151 to be transmitted to the transmitter coil 4. For example, the transmission channel 217 is realized with a signal line cable.

Further, in the third embodiment, the transmission channel 217 is configured to arrange, in at least a partial section on the outside of the shield room 200, RF pulse signals to be transmitted parallel to each other via the two channels.

The dividing circuitry 119 is provided at a stage subsequent to the generating circuitry 151 and is configured to divide the RF pulse signal generated by the generating circuitry 151 into the two channels included in the transmission channel 217. In this situation, the dividing circuitry 119 is an example of e divider described above.

In the third embodiment, similarly to the second embodiment, the dividing circuitry 119 functions as the first phase shifter described above. More specifically, of the two channels included in the transmission channel 217, the dividing circuitry 119 is configured to output the first RF pulse signal to the first channel CH1 and to output the second RF pulse signal of which the phase is inverted from the phase of the first RF pulse signal by 180°, to the second channel CH2. As a result, the phase of the first RF pulse signal output to the first channel CH1 and the phase of the second RF pulse signal output to the second channel CH2 are opposite phases of each other being different by 180°.

With this arrangement, because the phase of the first RF pulse signal and the phase of the second RF pulse signal are opposite phases of each other, the RF radiation noise occurring from the first channel CH1 and the RE radiation noise occurring from the second channel CH2 cancel out each other, in at least the partial section on the outside of the shield room 200. Consequently, it is possible to inhibit the RF radiation noise occurring in the transmission channels at the time of transmitting the RF pulse signals.

The phase shifting circuitry 218 is provided on the second channel CH2 at a stage preceding the transmitter coil 4 and is configured, similarly to the phase shifting circuitry 18 described in the first embodiment, to arrange the phase of the second RF pulse signal transmitted via the second channel CH2 to match a phase required by the specification of the transmitter coil 4. In this situation, the phase shifting circuitry 218 is an example of the second phase shifter described above. In this situation, similarly to the phase shifting circuitry 18 described in the first embodiment, the phase shifting circuitry 218 does not necessarily have to be a so-called digital circuit and may be realized with a cable.

As explained above, also in the third embodiment, the first RE pulse signal transmitted via the first channel CH1 and the second RF pulse signal transmitted via the second channel CH2 are transmitted while having the opposite phases of each other, the first channel CH1 and the second channel CH2 being included in the transmission channel 217. With this arrangement, the RF radiation noises occurring from the channels cancel out each other. It is therefore possible to inhibit the RF radiation noise occurring in the transmission channels at the time of transmitting the RF pulse signals. Further, because the unnecessary RE radiation noise is inhibited, it is possible to enhance EMC performance of the MRI apparatus 100.

Further, in the embodiments described above, the examples are explained in which the phases of the RF pulse signals transmitted via the two channels are arranged to be opposite phases of each other being different by 180°; however, possible embodiments are not limited to these examples. To inhibit the RF radiation noise efficiently, it is desirable to arrange the phase difference between the RF pulse signals transmitted via the two channels to be as close to 180° as possible. However, when the RE pulse signals transmitted via the two channels have phases that are different from each other even by a small amount, the signals weaken each other to no small extent. Thus, it is considered that the RF radiation noise will be reduced more than when the signals have the same phase as each other. Accordingly, it is acceptable when the phases of the RF pulse signals transmitted via the two channels are different from each other even by a small amount. In other words, as for the phases of the RF pulse signals transmitted via the two channels, any phase difference other than zero is acceptable.

Further, to inhibit the RE radiation noise efficiently, it is desirable, in each of the embodiments described above, to arrange the two channels used for transmitting the RF pulse signals parallel to each other to be positioned as close as possible to each other. For example, the cables realizing the channels may be twisted together or may be positioned adjacent to each other. Further, for example, connectors to which the cables realizing the channels are connected shall be arranged so as to be positioned as close as possible to each other.

Further, in the embodiments described above, the examples are explained in which the RE pulse signals are transmitted parallel to each other via the two channels; however, possible embodiments are not limited to these examples. For instance, it is acceptable to arrange RF pulse signals to be transmitted parallel to one another via three or more channels. For example, when RF pulse signals are transmitted via four channels, a first channel and a second channel shall be positioned close to each other, while a third channel and a fourth channel shall be positioned close to each other. Further, the phase of the RF pulse signal transmitted via the first channel shall be arranged to be 0°, while the phase of the RE pulse signal transmitted via the second channel shall be arranged to be 180°. Further, the phase of the RF pulse signal transmitted via the third channel shall be arranged to be 90°, while the phase RF pulse signal transmitted via the fourth channel shall be arranged to be 70°.

According to at least one aspect of the embodiments described above, it is possible to provide a magnetic resonance imaging apparatus and a method of transmitting an RF pulse signal that are capable of inhibiting the RF radiation noise that may occur in the transmission channels at the time of transmitting the RF pulse signals.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
   a generator configured to generate a radio frequency (RF) pulse signal;
   a transmitter coil configured to apply an RF magnetic field to an imaging space in which a subject is placed, on a basis of the RF pulse signal;
   a transmission channel configured to arrange, in at least a partial section between the generator and the transmitter coil, RF pulse signals to be transmitted parallel to one another via a plurality of channels;
   a first phase shifter configured to shift at least one of phases of the RF pulse signals to be transmitted via the plurality of channels, so that the phases of the RF pulse signals are in a relationship of being different from one another and thereby RF radiation noise occurring from the plurality of channels cancels out; and
   a second phase shifter configured to shift, in accordance with a phase amount shifted by the first phase shifter, at least one of phases of the RF pulse signals shifted by the first phase shifter at a stage prior to inputting the RF pulse signals to the transmitter coil.

2. The magnetic resonance imaging apparatus according to claim 1, wherein the first phase shifter shifts the at least one of phases of the RF pulse signals to be transmitted via the plurality of channels, so that the phases of the RF pulse signals are in a relationship of being opposite to each other.

3. The magnetic resonance imaging apparatus according to claim 1, wherein the transmission channel is provided between the generator and the transmitter coil and is configured to arrange the RF pulse signals to be transmitted parallel to one another via the plurality of channels in at least a partial section on an outside of a shield room.

4. The magnetic resonance imaging apparatus according to claim 1, wherein the first phase shifter shifts the at least one of phases of the RF pulse signals by using a direct digital synthesizer.

5. The magnetic resonance imaging apparatus according to claim 1, comprising a first generator configured to generate a first RF pulse signal and a second generator configured to generate a second RF pulse signal, wherein
   the transmission channel arranges the first RF pulse signal and the second RF pulse signal to be transmitted parallel to each other via the plurality of channels.

6. The magnetic resonance imaging apparatus according to claim 1, wherein the second phase shifter is provided at a stage preceding the transmitter coil and arranges the RF pulse signals which have been transmitted via the plurality of channels to have a same phase.

7. The magnetic resonance imaging apparatus according to claim 6, further comprising:
   a combiner interposed between the transmitter coil and the second phase shifter and configured to combine together from the second phase shifter the RF pulse signals having the same phase.

8. The magnetic resonance imaging apparatus according to claim 1, further comprising: a divider that is provided at a stage subsequent to the generator and is configured to divide the RF pulse signals into the plurality of channels.

9. A method of transmitting a radio frequency (RF) pulse signal in a magnetic resonance imaging apparatus including a generator configured to generate RF pulse signal, a transmitter coil configured to apply an RF magnetic field to an imaging space in which a subject is placed, on a basis of the RF pulse signal, a transmission channel configured to arrange, in at least a partial section between the generator and the transmitter coil, RF pulse signals to be transmitted parallel to one another via a plurality of channels, the method comprising:
   shifting at least one of phases of the RF pulse signals to be transmitted via the plurality of channels, so that the phases of the RF pulse signals are in a relationship of being different from one another and thereby RF radiation noise occurring from the plurality of channels cancels out; and
   shifting, in accordance with a shifted phase amount, at least one of phases of the RF pulse signals shifted by the first phase shifter at a stage prior to inputting the RF pulse signals to the transmitter coil.

* * * * *